United States Patent
Diaconu

(10) Patent No.: US 9,684,042 B2
(45) Date of Patent: Jun. 20, 2017

(54) MAGNETIC FIELD SENSOR WITH IMPROVED ACCURACY AND METHOD OF OBTAINING IMPROVED ACCURACY WITH A MAGNETIC FIELD SENSOR

(71) Applicant: ALLEGRO MICROSYSTEMS, LLC, Worcester, MA (US)

(72) Inventor: Aurelian Diaconu, Londonderry, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 205 days.

(21) Appl. No.: 14/633,190

(22) Filed: Feb. 27, 2015

(65) Prior Publication Data
US 2016/0252590 A1    Sep. 1, 2016

(51) Int. Cl.
| | | |
|---|---|---|
| G01R 33/07 | (2006.01) | |
| G01D 5/14 | (2006.01) | |
| G01R 33/00 | (2006.01) | |

(52) U.S. Cl.
CPC ........... *G01R 33/077* (2013.01); *G01D 5/142* (2013.01); *G01R 33/0023* (2013.01)

(58) Field of Classification Search
CPC ................................................. G01R 33/0023
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |

(Continued)

FOREIGN PATENT DOCUMENTS

| | | |
|---|---|---|
| DE | 10 2005 014 509 B4 | 10/2006 |
| DE | 10 2006 037 226 A1 | 2/2008 |

(Continued)

OTHER PUBLICATIONS

Kaufmann et al.; "Novel Coupling Concept for Five-Contact Vertical Hall Devices;" IEEE 2011 16th International Solid-State Sensors, Actuators and Microsystems Conference (Transducers); Jun. 5-9, 2011; pp. 2855-2858.

(Continued)

*Primary Examiner* — Son Le
*Assistant Examiner* — Dustin Dickinson
(74) *Attorney, Agent, or Firm* — Daly, Crowley, Mofford & Durkee, LLP

(57) ABSTRACT

A magnetic field sensor includes a circular vertical Hall (CVH) sensing element comprising a plurality of vertical Hall elements, each one of the plurality of vertical hall elements comprising respective first and second current receiving contacts. The magnetic field sensor additionally includes a sequence switches circuit coupled to the plurality of vertical Hall elements. The magnetic field sensor also includes a first current source sequentially coupled by the sequence switches circuit to the first current receiving contact of sequentially selected ones of the plurality of vertical Hall elements. The magnetic field sensor further includes a second current source sequentially coupled by the sequence switches circuit to the second current receiving contact of the sequentially selected ones of the plurality of vertical Hall elements. The first and second current sources can swap couplings in half-period intervals for each of a plurality of coupling arrangements. A corresponding method is also described.

20 Claims, 10 Drawing Sheets

(56) References Cited

U.S. PATENT DOCUMENTS

| | | | |
|---|---|---|---|
| 4,829,352 A | 5/1989 | Popovic et al. | |
| 5,541,506 A | 7/1996 | Kawakita et al. | |
| 5,572,058 A | 11/1996 | Biard | |
| 5,612,618 A | 3/1997 | Arakawa | |
| 5,619,137 A | 4/1997 | Vig et al. | |
| 5,621,319 A | 4/1997 | Bilotti et al. | |
| 5,657,189 A | 8/1997 | Sandhu | |
| 5,694,038 A | 12/1997 | Moody et al. | |
| 5,831,513 A | 11/1998 | Lue | |
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,878,272 B2 * | 4/2005 | Kawaguchi | A61M 1/14 210/109 |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 2006/0011999 A1 | 1/2006 | Schott et al. | |
| 2009/0121707 A1 | 5/2009 | Schott | |
| 2009/0174395 A1 | 7/2009 | Thomas et al. | |
| 2010/0156397 A1 | 6/2010 | Yabusaki et al. | |
| 2010/0164491 A1 | 7/2010 | Kejik et al. | |
| 2011/0248708 A1 | 10/2011 | Thomas et al. | |
| 2012/0313635 A1* | 12/2012 | Daubert | G01R 33/077 324/251 |
| 2014/0103921 A1* | 4/2014 | Raman | G01R 33/0023 324/251 |
| 2014/0132254 A1* | 5/2014 | Thomas | G01R 1/44 324/225 |
| 2014/0176125 A1* | 6/2014 | Friedrich | G01R 33/0023 324/207.2 |
| 2015/0070002 A1* | 3/2015 | Schott | G01D 5/145 324/207.2 |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Allegro Microsystems, Inc.; "High Precision Linear Hall Effect Sensor IC with a Push/Pull, Pulse Width Modulated Output;" A1351; pp. 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34$^{th}$ Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference; Oct. 25-28, 20009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSiC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I$^2$C Interface;" Aug. 14, 2008; 9 pages.

MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

(56) References Cited

OTHER PUBLICATIONS

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications," published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; "Allegro Microsystems, Inc.; AN296061 Data Sheet: Ring Magnet Speed Sensing for Electronic Power Steering;" published Jul. 21, 2009; pp. 1-4.

Freitas et al.; "Giant Magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor + Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Posiitioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The 8th International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall Magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vetor Probe for Contactless Angle Measurement System;" International Electron Devices Meeting; Dec. 8-11, 1996; pp. 533-536.

SENSIMA technology sa; "CVHD: a new concept of Angular Position Sensor," Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20ll/Sensori%20e%20transduttori/Data%20Sheet%20-%202SA-10.pdf; pp. 1-7.

van der Meer; et al; "CMOS quad spinning-current Hall-sensor system to compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

Banjevic; "High Bandwidth CMOS Magnetic Sensors Based on the Miniaturized Circular Vertical Hall Device;" Sep. 2011; 153 pages.

Drljaca, et al.; "Nonlinear Effects in Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226.

Melexis MLX 90324; ""Under-the-Hood" Triaxis Rotary Position feat. SENT Protocol;" 3901090324 Data Sheet; Dec. 2008; 40 pages.

Petrie; "Circular Vertical Hall Magnetic Field Sensing Element and Method with a Plurality of Continuous Output Signals;" U.S. Appl. No. 13/035,243, filed Feb. 25, 2011; 56 pages.

* cited by examiner

| Vertical Hall element | First output signal generating contact | Second output signal generating contact | Sequenced Signal steps produced at the corresponding output signal generating contacts |
|---|---|---|---|
| 1 | 2 | 4 | $I_B R_{4,3} - I_A R_{2,3}$ |
| 2 | 3 | 5 | $I_B R_{5,4} - I_A R_{3,4}$ |
| 3 | 4 | 6 | $I_B R_{6,5} - I_A R_{4,5}$ |
| 4 | 5 | 7 | $I_B R_{7,6} - I_A R_{5,6}$ |
| 5 | 6 | 8 | $I_B R_{8,7} - I_A R_{6,7}$ |
| 6 | 7 | 9 | $I_B R_{9,8} - I_A R_{7,8}$ |
| 7 | 8 | 10 | $I_B R_{10,9} - I_A R_{8,9}$ |
| 8 | 9 | 11 | $I_B R_{11,10} - I_A R_{9,10}$ |
| 9 | 10 | 12 | $I_B R_{12,11} - I_A R_{10,11}$ |
| 10 | 11 | 13 | $I_B R_{13,12} - I_A R_{11,12}$ |

MAGNETIC FIELD SENSOR WITH IMPROVED ACCURACY AND METHOD OF OBTAINING IMPROVED ACCURACY WITH A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD OF THE DISCLOSURE

This disclosure relates generally to magnetic field sensors and, more particularly, to a magnetic field sensor that can provide an output signal with improved accuracy that is representative of an angle of rotation and a speed of rotation of a target object.

BACKGROUND OF THE DISCLOSURE

Magnetic field sensing elements can be used in a variety of applications. In one application, a magnetic field sensing element can be used to detect a direction of a magnetic field, i.e., and angle of the direction of the magnetic field. In another application, a magnetic field sensing element can be used to sense an electrical current. One type of current sensor uses a Hall Effect magnetic field sensing element in proximity to a current-carrying conductor.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element provides output signals from a plurality of vertical Hall elements from which it is constructed. Each vertical Hall element can have an undesirable and different DC offset.

The CVH sensing element is but one sensing element that can provide an output signal representative of an angle of a magnetic field, i.e., an angle sensor. For example, an angle sensor can be provided from a plurality of separate vertical Hall elements or a plurality of magnetoresistance elements.

It would be desirable to reduce the DC offsets of a plurality of magnetic field sensing elements (e.g., vertical Hall elements of a CVH sensing element). It would be further desirable to provide a magnetic field sensor with improved accuracy.

SUMMARY

The present disclosure relates generally to concepts, systems, circuits, and techniques for reducing DC offsets in a magnetic field sensor. The present disclosure also relates to a magnetic field sensor with improved accuracy.

In one aspect of the concepts described herein, a magnetic field sensor includes a circular vertical Hall (CVH) sensing element including a plurality of vertical Hall elements. The plurality of vertical hall elements of the CVH sensing element include respective first and second current receiving contacts, respective first and second output signal generating contacts, and a respective at least one reference contact. Additionally, the at least one reference contact is positioned between the first and second current receiving contacts, the first output signal generating contact is positioned between the at least one reference contact and the first current receiving contact, and the second output signal generating contact is positioned between the at least one reference contact and the second current receiving contact. The plurality of vertical Hall elements is configured to generate a plurality of magnetic field signals, each magnetic field signal responsive to a magnetic field.

The magnetic field sensor additionally includes a sequence switches circuit coupled to the plurality of vertical Hall elements. In one aspect, the sequences switches circuit is operable to sequentially select from among the plurality of vertical Hall elements to generate sequenced signal steps (or steps of a sequenced signal).

The magnetic field sensor also includes a first current source sequentially coupled by the sequence switches circuit to the first current receiving contact of sequentially selected ones of the plurality of vertical Hall elements. In one aspect, the first current source is operable to provide, at first sequential times, a first current signal to the first current receiving contact of the sequentially selected ones of the plurality of vertical Hall elements.

The magnetic field sensor further includes a second current source sequentially coupled by the sequence switches circuit to the second current receiving contact of the sequentially selected ones of the plurality of vertical Hall elements. In one aspect, the second current source is operable to provide, at the same first sequential times, a second current signal to the second current receiving contact of the sequentially selected ones of the plurality of vertical Hall elements.

The magnetic field sensor additionally includes an amplifier circuit coupled to receive the sequenced signal steps produced at the first and second output signal generating contacts of the sequentially selected ones of the plurality of vertical Hall elements. In one aspect, in response to the sequenced signal steps, the amplifier circuit is configured to generate an amplified signal representative of sequentially selected ones of the plurality of magnetic field signals.

Features of the magnetic field sensor may include one or more of the following in any combination. The magnetic field sensor may not be configured in a current spinning arrangement. The first current signal and the second current signal may be substantially equal in magnitude. The first current signal and the second current signal may be unequal in magnitude. The amplifier circuit may be coupled to the select first and second output generating contacts in a Kelvin connection arrangement. An input impedance of the amplifier circuit may be substantially more than an output impedance of the first and second output generating contacts of the sequentially selected ones of the plurality of vertical Hall elements. Each selected one of the plurality of vertical Hall elements may include five vertical Hall element contacts. Each selected one of the plurality of vertical Hall elements may comprise more than five vertical Hall element contacts. The at least one reference contact may be coupled to a reference potential. The reference potential may be ground, which may be a system ground, earth ground, or otherwise.

In another aspect of the concepts described herein, a method includes generating a plurality of magnetic field signals with a circular vertical Hall (CVH) sensing element, the CVH sensing element including a plurality of vertical Hall elements. Each one of the plurality of vertical hall elements includes respective first and second current receiving contacts, respective first and second output signal generating contacts, and a respective at least one reference contact. The at least one reference contact is positioned between the first and second current receiving contacts, the first output signal generating contact is positioned between the at least one reference contact and the first current receiving contact, and the second output signal generating contact is positioned between the at least one reference contact and the second current receiving contact. Each magnetic field signal is responsive to a magnetic field.

The method additionally includes sequentially selecting from among the plurality of vertical Hall elements. The method also includes generating a first current signal and providing, at first sequential times, the first current signal to the first current receiving contact of sequentially selected ones of the plurality of vertical Hall elements. The method further includes generating a second current signal and providing, at the same first sequential times, the second current signal to the second current receiving contact of the sequentially selected ones of the plurality of vertical Hall elements.

The method additionally includes generating a first sequenced signal step (or first step of a sequenced signal), responsive to an external magnetic field, at the first and second output generating contacts of the sequentially selected ones of the plurality of vertical Hall elements. The method further includes generating an amplified signal representative of sequentially selected ones of the plurality of magnetic field signals in response to at least the first sequenced signal step.

Features of the method may include one or more of the following in any combination. The first current signal and the second current signal may be substantially equal in magnitude. The first current signal and the second current signal may be unequal in magnitude. Each selected one of the plurality of vertical Hall elements may include five vertical Hall element contacts. Each selected one of the plurality of vertical Hall elements may comprise more than five vertical Hall element contacts. The at least one reference contact may be coupled to a reference potential. The reference potential may be ground, which may be a system ground, earth ground, or otherwise.

In another aspect of the concepts described herein, a magnetic field sensor includes a circular vertical Hall (CVH) sensing element including a plurality of vertical Hall elements. The plurality of vertical hall elements of the CVH sensing element include respective first and second current receiving contacts, respective first and second output signal generating contacts, and a respective at least one reference contact. Additionally, the at least one reference contact is positioned between the first and second current receiving contacts, the first output signal generating contact is positioned between the at least one reference contact and the first current receiving contact, and the second output signal generating contact is positioned between the at least one reference contact and the second current receiving contact. The plurality of vertical Hall elements is configured to generate a plurality of magnetic field signals, each magnetic field signal responsive to a magnetic field.

The magnetic field sensor additionally includes means for sequentially selecting from among the plurality of vertical Hall elements to generate sequenced signal steps. The magnetic field sensor also includes means for providing, at first sequential times, a first current signal to the first current receiving contact of the sequentially selected ones of the plurality of vertical Hall elements. The magnetic field sensor further includes means for providing, at the same first sequential times, a second current signal to the second current receiving contact of the sequentially selected ones of the plurality of vertical Hall elements. The magnetic field sensor additionally includes means for generating an amplified signal representative of sequentially selected ones of the plurality of magnetic field signals in response to receiving the sequenced signal steps produced at the first and second output signal generating contacts of the sequentially selected ones of the plurality of vertical Hall elements.

Features of the magnetic field sensor may include one or more of the following in any combination. The first current signal and the second current signal may be substantially equal in magnitude. The means for generating an amplified signal is coupled to the select first and second output generating contacts in a Kelvin connection arrangement.

BRIEF DESCRIPTION OF THE DRAWINGS

The foregoing features of the disclosure, as well as the disclosure itself may be more carefully understood from the following detailed description of the drawings, which:

FIG. 7B is a table illustrating example offset voltage cancellations of selected vertical Hall elements of an example CVH sensing element.

DETAILED DESCRIPTION

Figure 1:
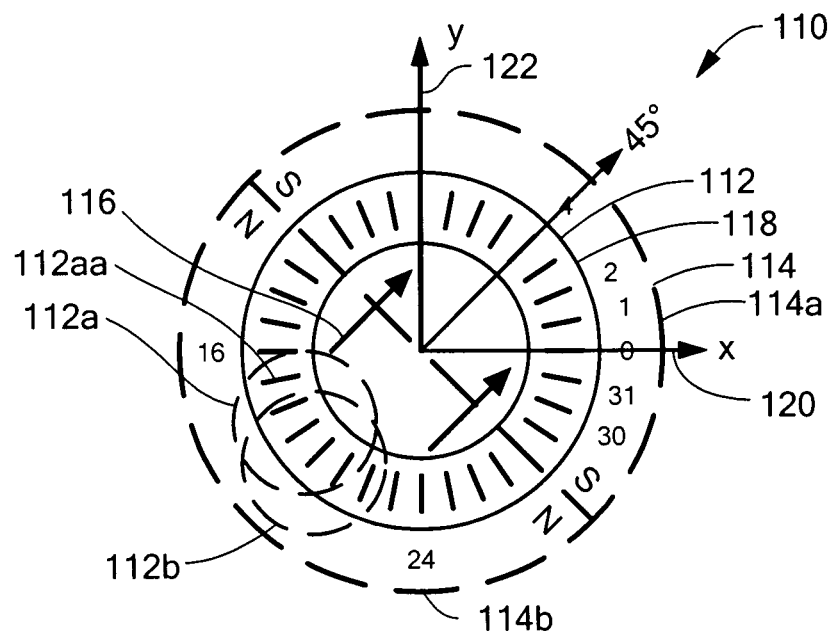
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

The features and other details of the concepts, systems, and techniques sought to be protected herein will now be more particularly described. It will be understood that any specific embodiments described herein are shown by way of illustration and not as limitations of the disclosure. The principal features of this disclosure can be employed in various embodiments without departing from the scope of the concepts sought to be protected. Embodiments of the present disclosure and associated advantages may be best understood by referring to the drawings, where like numerals are used for like and corresponding parts throughout the various views.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an isotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a halfbridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While a circular vertical Hall (CVH) element, which has a plurality of vertical Hall elements, is described in examples below, it should be appreciated that the same or similar techniques and circuits apply to any type of magnetic field sensing element(s) arranged in a manner to detect an angle of a pointing direction of a magnetic field, i.e., a rotation angle of a target object to which a magnet is attached.

Referring to FIG. 1, a circular vertical Hall (CVH) element 112 includes a circular implant and diffusion region 118 in a substrate (not shown). The CVH sensing element 112 has a plurality of vertical Hall elements, of which a vertical Hall element 112a is but one example. In some embodiments, the common implant and diffusion region 118 can be characterized as a common epitaxial region upon a substrate, bounded by semiconductor isolation structures.

Each vertical Hall element has a plurality of Hall element contacts (e.g., four or five contacts), e.g., 112aa. Each vertical Hall element contact can be comprised of a metal contact over a contact diffusion region (a pickup) diffused into the common implant and diffusion region 118.

A particular vertical Hall element (e.g., 112a) within the CVH sensing element 112, which, for example, can have five adjacent contacts, can share some, for example, four, of the five contacts with a next vertical Hall element (e.g., 112b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can positioned along an x-axis 120 and a center of vertical Hall element 118 can be positioned along a y-axis 122. In the exemplary CVH sensing element 112, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 114 having a north side 114b and a south side 114a can be disposed over the CVH 112. The circular magnet 114 tends to generate a magnetic field 116 having a direction from the north side 114b to the south side 114a, here shown to be pointed to a direction of about forty-five degrees relative to x-axis 120.

In some applications, the circular magnet 114 is mechanically coupled to a rotating target object, for example, an automobile steering shaft of an automobile camshaft, and is subject to rotation relative to the CVH sensing element 112. With this arrangement, the CVH sensing element 112, in combination with an electronic circuit described below, can generate a signal related to the angle of rotation of the magnet 114, i.e., an angle of rotation of the target object to which the magnet is coupled.

Figure 1A:
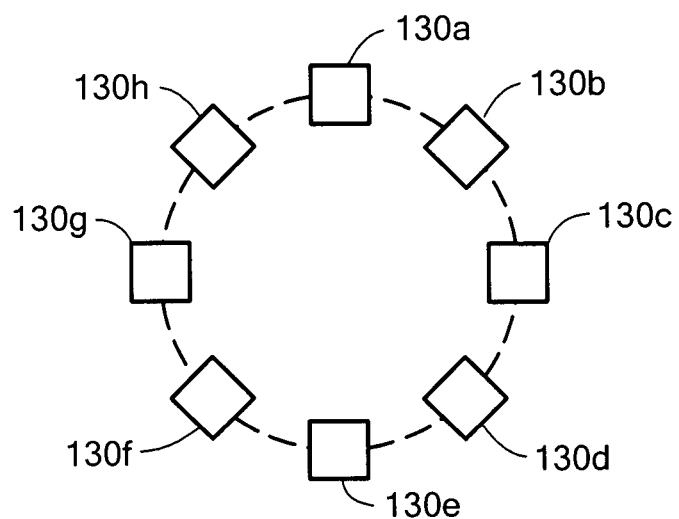
FIG. 1A is a pictorial showing a plurality of magnetic field sensing elements.

Referring now to FIG. 1A, a plurality of magnetic field sensing elements 130a-130h, in a general case, can be any type of magnetic field sensing elements. The magnetic field sensing elements 130a-130h can be, for example, separate vertical Hall elements or separate magnetoresistance elements, each having an axis of maximum response parallel to a surface of a substrate 34, each pointing in a different direction in the plane of the surface. These magnetic field sensing elements can be coupled to an electronic circuit the same as or similar to electronic circuits described below in conjunction with FIGS. 3 and 6. There can also be a magnet the same as or similar to the magnet 114 of FIG. 1 disposed proximate to the magnetic field sensing elements 130a-130h.

Figure 2:
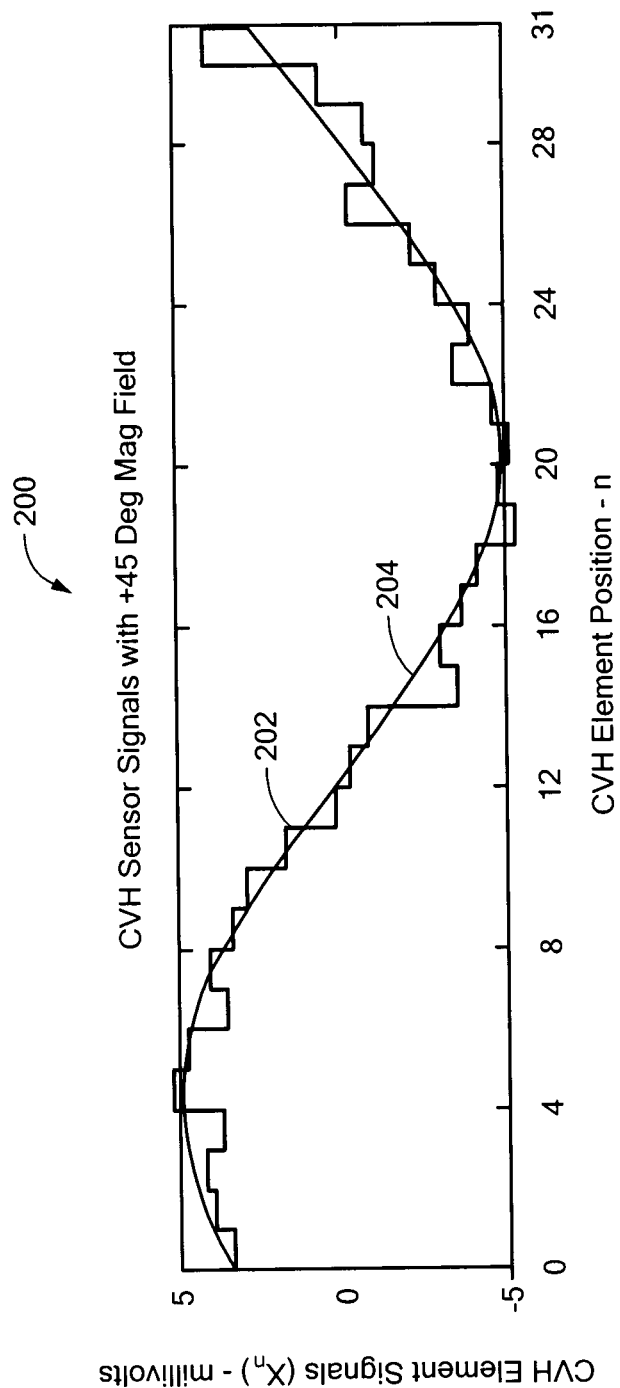
FIG. 2 is a graph showing an output signal as may be generated by the CVH sensing element of FIG. 1 or by the plurality of magnetic field sensing elements of FIG. 1A.

Referring now to FIG. 2, a graph 200 has a horizontal axis with a scale in units of CVH vertical Hall element position, n, around a CVH sensing element, for example, the CVH sensing element 112 of FIG. 1. The graph 200 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 200 includes a signal 202 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 120 and vertical Hall element 8 is centered along the y-axis 122. In the exemplary CVH sensing element 112, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 116 pointing at positive forty-five degrees, a maximum positive signal is achieved from a vertical Hall element centered at position 4, which is aligned with the magnetic field 116 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 116 of FIG. 1, such that a line drawn between the vertical Hall element contacts (e.g., five contacts) of the vertical Hall element at position 20 is also perpendicular to the magnetic field.

A sine wave 204 is provided to more clearly show ideal behavior of the signal 202. The signal 202 has variations due to vertical Hall element offsets, which tend to cause corresponding variations of output signals causing them to be too high or too low relative to the sine wave 204, in accordance with offset errors for each element. The offset signal errors are undesirable.

Full operation of the CVH sensing element 112 of FIG. 1 and generation of the signal 202 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 202 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 202 when current spinning is not used. However, for embodiments in which current spinning is used or in which a current swapping operation is performed, each step of the signal 202 can be comprised of several sub-steps (not shown, e.g., two sub-steps or four sub-steps). Each sub-step may, for example, be indicative of a current spinning "phase" in embodiments where current spinning is used.

Current spinning and current spinning phases are described more fully below in conjunction with FIGS. 4-4C.

It will be understood that a phase of the signal 202 is related to an angle of the magnetic field 116 of FIG. 1 relative to position zero of the CVH sensing element 112. It will also be understood that a peak amplitude of the signal 202 is generally representative of a strength of the magnetic field 16. Using electronic circuit techniques described above in PCT Patent Application No. PCT/EP2008/056517, or using other techniques described below, a phase of the signal 202 (e.g., a phase of the signal 204) can be found and can be used to identify the pointing direction of the magnetic field 116 of FIG. 1 relative to the CVH sensing element 112.

The signal 202 is also referred to herein as a "sequenced signal" 202, which will be understood to be comprised of sequential ones of a plurality of magnetic field signals or "steps," each magnetic field signal generated by a respective one of a plurality of magnetic field sensing elements, e.g., the plurality of vertical Hall elements within a CVH sensing element.

Figure 3:
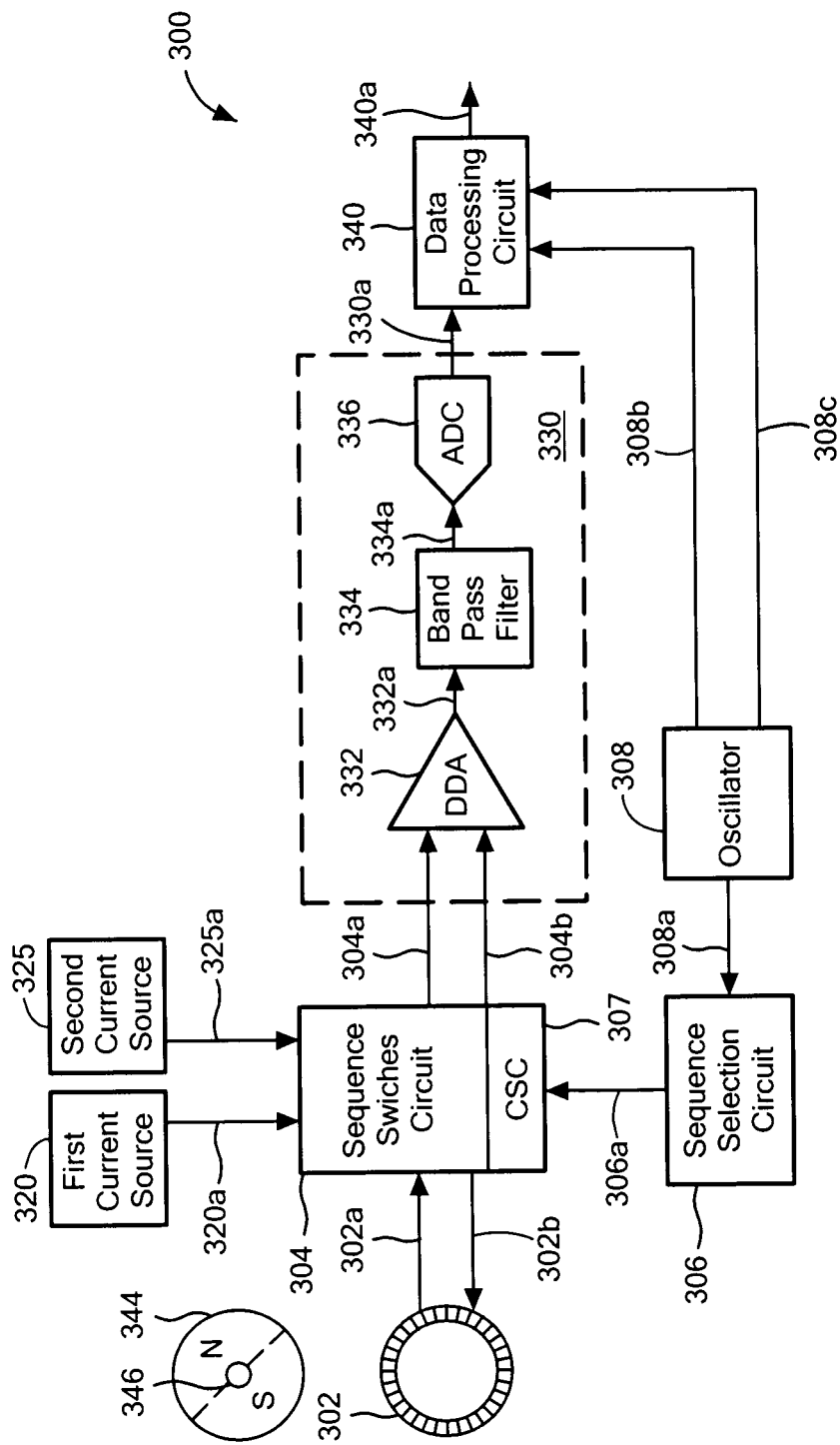
FIG. 3 is a block diagram of an example magnetic field sensor having a CVH sensing element, a plurality of current sources, and a sequence switching circuit operable to sequentially select from among a plurality of vertical Hall elements of the CVH sensing element.

Referring now to FIG. 3, an example magnetic field sensor 300 includes a CVH sensing element 302 having a plurality of vertical Hall elements, with each vertical Hall element comprising a group of vertical Hall element contacts (e.g., five vertical Hall element contacts). More specifically, each vertical Hall element comprises respective first and second current receiving contacts, respective first and second output signal generating contacts, and a respective at least one reference contact, as will be further discussed below.

In some embodiments, the CVH sensing element 302 can be the same as or similar to the CVH sensing element 112 described above in conjunction with FIG. 1, and in one aspect the CVH sensing element 302 can be disposed proximate to a two pole magnet 314 coupled to a target object 316, which magnet 314 can be the same as or similar to the magnet 114 of FIG. 1. However, in other embodiments, the CVH sensing element 302 can be replaced by a group of magnetic sensing elements that are the same as or similar to those described above in conjunction with FIG. 1A. The CVH sensing element 302 is configured to generate a plurality of magnetic field signals 302a, one at a time. Thus, couplings that carry the magnetic field signals 302a can include a plurality of couplings to the plurality of vertical Hall elements within the CVH sensing element 302.

The CVH sensing element 302 can be coupled to a sequence switches circuit 304 that sequences through and sequentially selects from among the vertical Hall elements of the CVH sensing element 302. The sequence switches circuit 304 can also select respective first and second current receiving contacts, respective first and second output signal generating contacts, and a respective at least one reference contact of the sequentially selected vertical Hall elements to generate a differential sequenced signal 304a, 304b. The differential sequenced signal 304a, 304b can be the same as or similar to the sequenced signal 202 of FIG. 2.

The sequence switches circuit 304 can be coupled to a sequences selection circuit 306, which can be configured to generate a sequence control signal 306a. The sequence control signal 306a may, for example, control and/or indicate switching (or indexing) of the vertical Hall elements and selection of the respective first and second current receiving contacts, the respective first and second output signal generating contacts, and the respective at least one reference contact.

The sequence selection circuit 306 can also be coupled to an oscillator 308. The oscillator 308 can be configured to provide a clock signal 308a to the sequence selection circuit 306 for sequential selection of sequential ones of the vertical Hall elements of the CVH sensing element 302.

The sequence switches circuit 304 can also be coupled to or can comprise a current switches circuit (CSC) 307 for coupling current sources (here, first and second current sources 320, 325, as will be discussed below) to selected vertical hall element contacts of selected ones of the vertical Hall elements within the CVH sensing element 302. Current spinning or chopping described below in conjunction with FIGS. 4-4C is not used. Instead, a particular phase (i.e., coupling of current sources and coupling of output contacts to each vertical hall element) is selected, which remains the same phase for each selected vertical Hall element within the CVH sensing element 302. It will become apparent from discussion below that the selected phase is a phase shown below in FIG. 4.

The sequence switches circuit 304 can additionally be coupled to a plurality of current sources (here, first and second current sources 320, 325), which can be configured to generate a respective plurality of current signals 320a, 325a. The sequence switches circuit 304 can be configured to couple the first and second current sources 320, 325 to the respective current receiving contacts of sequentially selected ones of the plurality of vertical Hall elements and to provide the current signals 320a, 325a generated by the current sources 320, 325 to the respective current receiving contacts. In response thereto, the differential sequenced signal 304a, 304b can be produced at the first and second output signal generating contacts of the sequentially selected ones of the vertical Hall elements.

The differential sequenced signal 304a, 304b can be coupled to a signal processing system 330, which can be configured to receive and process the differential sequenced signal 304a, 304b. In the example embodiment shown, the signal processing system 330 comprises a differential amplifier (DA) 332, a band-pass filter 334, and an analog-to-digital converter (ADC) 336. The DA 332, the band-pass filter 334, and the analog-to-digital converter (ADC) 336 may be provided separately or in any suitable sub combination.

The DA 332 can be coupled to receive the differential sequenced signal 304a, 304b and configured to generate an amplified signal 332a. In one embodiment, the DA 332 is coupled to receive the differential sequenced signal 304a, 304b from the first and second output signal generating contacts in a Kelvin connection arrangement described more fully below in conjunction with FIG. 8.

A bandpass filter 334 can be coupled to receive the amplified signal 332a and configured to generate a filtered signal 334a. An analog-to-digital converter (ADC) 336 can be coupled to receive the filtered signal 334a and configured to generate a converted digital signal 330a.

The signal processing system 330, particularly the ADC 336 of the signal processing system 330, can be coupled to a data processing circuit 340. The data processing circuit 340 can be coupled to receive the converted digital signal 330a from the ADC 336 and clock signals 308b, 308c from the oscillator 308 and can be configured to generate an x-y angle signal 340a having x-y angle values indicative of an angle of a magnetic field generated by the magnet 314. In one embodiment, the data processing circuit 340 compares a relative phase of the converted digital signal 330a and one or more of the clock signals 308b, 308c in generating the x-y angle signal 340a. A phase of the x-y angle signal 340a can change, and therefore, can be representative of a rotating magnetic field when the magnet 314 rotates.

In operation, the x-y angle signal 340a would have a larger angle error component were it not for sequential selection from among the plurality of vertical Hall elements of the CVH sensing element 302 and selection of the respective first and second current receiving contacts, the respective first and second output signal generating contacts, and the respective at least one reference contact by the sequence switches circuit 304. The angle error component is described more fully below in conjunction with FIG. 5. Let it suffice here to say that the angle error component is an angle error component that would otherwise cause the x-y angle signal 340a to not be perfectly representative of the true angle of the magnetic field generated by the magnet 314.

Additional aspects of the example magnetic field sensor 300, with particular focus on the coupling and sequential selection from among the plurality of vertical Hall elements and their respective current receiving contacts, respective output signal generating contacts, and respective reference contacts are described in greater detail below in conjunction with FIGS. 6-8.

Figure 4:
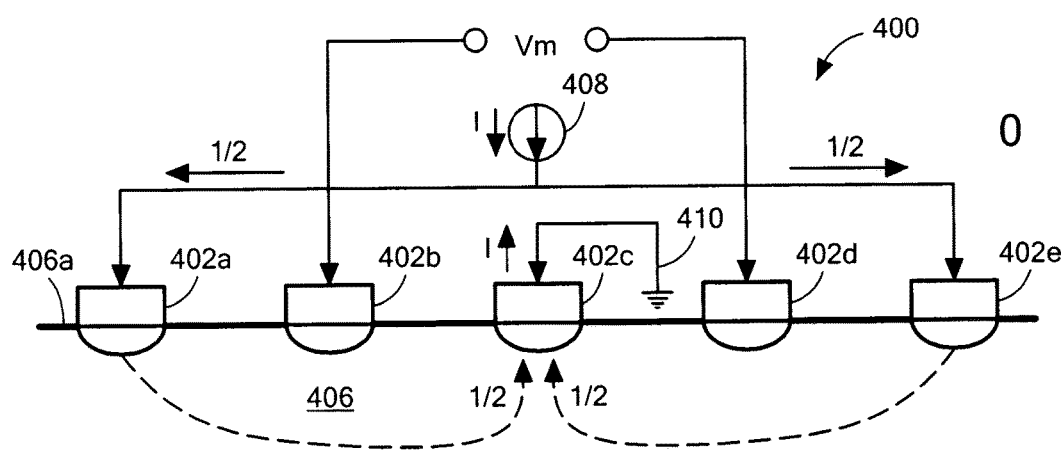
FIGS. 4-4C are side views of example vertical Hall elements of the CVH sensing element of FIG. 3 when coupled into four current spinning phases, the four phases phase associated with operation of each one of the vertical Hall elements of a typical CVH sensing element.
Figure 4A:
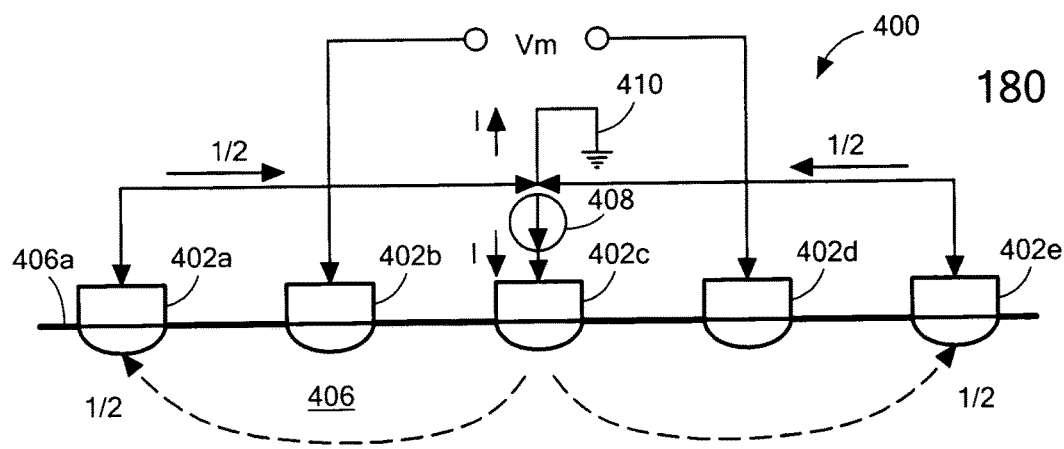
Figure 4B:
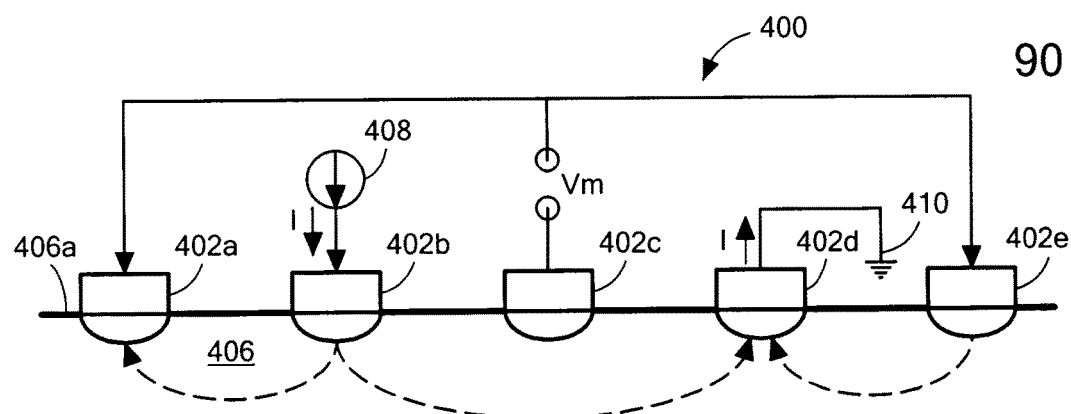
Figure 4C:
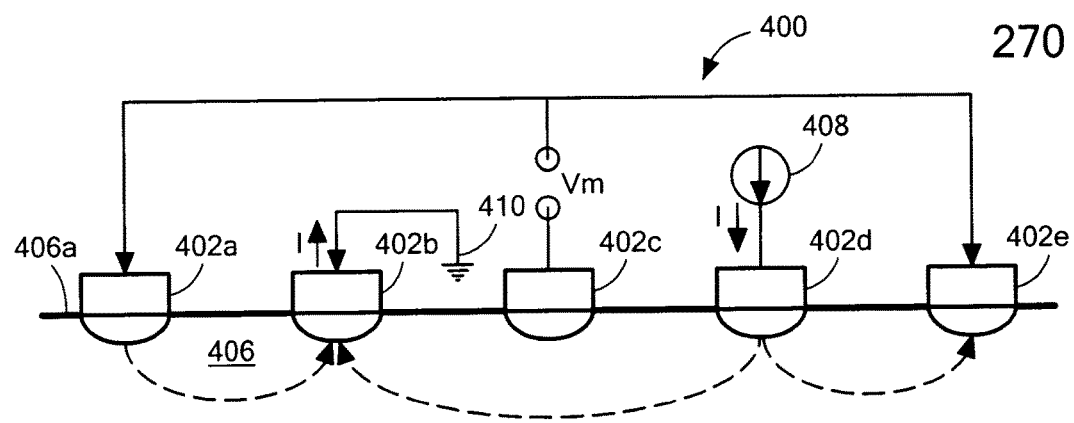

Referring now to FIGS. 4-4C, the block diagrams shown are representative of a four phase current spinning or chopping that can be used for any vertical Hall element having five contacts. The four phases are described herein for clarity. However, it will become apparent that current spinning is not used with the magnetic field sensor of FIG. 3, and instead, each selected vertical Hall element uses the arrangement of FIG. 4.

It should be appreciated that such current spinning can be used for each selected vertical Hall element within the conventional CVH sensing element 112 of FIG. 1. It should also be appreciated that such current spinning can also be used for separate magnetic field sensing elements, for example, the magnetic field sensing elements 130a-130h of FIG. 1A, where the magnetic field sensing elements 130a-130h are selected and chopped one of the time.

Orientation of current driven nodes and signal notes of FIGS. 4-4A are shown from the perspective of looking from outside of a ring of vertical Hall elements, e.g., from outside of a CVH sensing element. It will be understood that, naming conventions described below in terms of 0, 90, 180, and 270 degree phases are somewhat arbitrary. These naming conventions come from use of similar naming conventions used for planar Hall effect elements, where, during the sequence of current spinning, current is sequentially injected into nodes that are physically ninety degrees apart. There are no such physical angles that are ninety degrees apart for vertical Hall elements. Nevertheless, FIGS. 4, 4A, 4B, and 4C are referred to herein as zero, ninety, one hundred eighty, and two hundred seventy degrees phases, respectively.

Referring now to FIG. 4, a vertical Hall element 400 is comprised of five vertical Hall element contacts, namely, first, second, third, fourth, and fifth vertical Hall element contacts, 402a, 402b, 402c, 402d, 402e, respectively. In a first chopping or current spinning phase (zero degree phase), a drive circuit 408, can be coupled to the first and fifth vertical Hall element contacts 402a, 402e, respectively, which are coupled together, and can provide a total current of I, half of the current, I/2, flowing to the first vertical a Hall element contact 402a and half of the current, I/2, flowing to the fifth vertical Hall element contact 402e. The third vertical Hall element contact 402c is coupled to a voltage reference 410, for example, ground. Currents from the current source 408 flow from the first and fifth vertical Hall element contacts 402a, 402e, respectively, through a substrate 406 (e.g., through an epitaxial layer upon a substrate) of the vertical Hall element 400 to the third vertical Hall element contact 402c, as represented by dashed lines.

A signal, Vm, responsive to an external magnetic field, results between the second and fourth vertical Hall element contacts 402b, 402d, respectively. Thus, in the first current spinning phase, current spinning switches can select the second and fourth vertical Hall element contacts 402b, 402d to provide an output signal, and can select the first, fifth, and third vertical Hall element contacts 402a, 402e, 402c, respectively. Couplings during other current spinning phases described below will be apparent.

Referring now to FIG. 4A, in which like elements of FIG. 4 are shown having like reference designations, in a second current spinning phase (one hundred eighty degree phase) of the same vertical Hall element 400 (same five vertical Hall element contacts), couplings are changed by current spinning switches. In the second phase, the current source 408 is coupled to the third vertical Hall element contact 402c, and the first and fifth vertical Hal element contacts 402a, 402e, respectively, are coupled together and to the reference voltage 410. Thus, the currents flow through the substrate 406 in opposite directions from those shown in FIG. 4.

As in FIG. 4, a signal, Vm, responsive to an external magnetic field, results between the second and fourth vertical Hall element contacts, 402b, 402d, respectively. The signal, Vm, of FIG. 4A is like the signal, Vm, of FIG. 4. However, the offset voltage within the signals can be different, e.g., different in signal.

Referring now to FIG. 4B, in which like elements of FIGS. 4 and 4A are shown having like reference designations, in a third current spinning phase (ninety degree phase) upon the same vertical Hall element 400 (same five vertical Hall element contacts), couplings are again changed by current spinning switches. In the third phase, the current source 408 is coupled to the second vertical Hall element contact 402b, and the fourth vertical Hall element contact 402d is coupled to the reference voltage 410. Thus, a current flows from the second vertical Hall element contact 402b through the substrate 406 to the fourth vertical Hall element contact 402d.

The first and fifth vertical Hall element contacts 402a, 402e, respectively, are coupled together. Some current also flows from the second vertical Hall element contact 402b through the substrate 406 to the first vertical Hall element contact 402a and through the mutual coupling to the fifth vertical Hall element contact 402c. Some current also flows from the fifth vertical Hall element contact 402e through the substrate 406 to the fourth vertical Hall element contact 402d.

A signal, Vm, responsive to an external magnetic field, results between the first vertical Hall element contact 402a first (and the fifth vertical Hall element contact 402e) and the third vertical Hall element contact 402c. The signal, Vm, of FIG. 4B is like the signal, Vm, of FIGS. 4 and 4A. However, the offset voltage within the signal can be different.

Referring now to FIG. 4C, in which like elements of FIGS. 4-4B are shown having like reference designations, in a fourth chopping phase (two hundred seventy degree phase) upon the same vertical Hall element 400 (same five vertical Hall element contacts), couplings are again changed by current spinning switches. In the fourth phase, the current is reversed from that shown in FIG. 4B. The current source 408 is coupled to the fourth vertical Hall element contact 402*d*, and the second vertical Hall element contact 402*b* is coupled to the reference voltage 410. Thus, a current flows from the fourth vertical Hall element contact 402*d* through the substrate 406 to the second vertical Hall element contact 402*b*.

The first and fifth vertical Hall element contacts 402*a*, 402*e*, respectively, are coupled together. Some current also flows from the fourth vertical Hall element contact 402*d* through the substrate 406 to the fifth vertical Hall element contact 402*e*, through the mutual coupling to the first vertical Hall element contact 402*a*. Some current also flows from the first vertical Hall element contact 402*a* through the substrate 406 to the second vertical Hall element contact 402*b*.

A signal, Vm, responsive to an external magnetic field, results between the first vertical Hall element contact 402*a* (and the fifth vertical Hall element contact 402*e*) and the third vertical Hall element contact 402*c*. The signal, Vm, of FIG. 4C is like the signal, Vm, of FIGS. 4-4B. However, the offset voltage within the signal can be different.

The signals, Vm, provided by the four phases of chopping of FIGS. 4-4C are responsive to an external magnetic field.

As described above, after generating the four current spinning phases on any one vertical Hall element within the CVH sensing element 402, the current spinning arrangements of FIGS. 4-4C can move to a next vertical Hall element, e.g., five vertical Hall element contacts offset by one vertical Hall element contact from those shown in FIGS. 4-4C, and the four current spinning phases can be performed on the new vertical Hall element by operation of current spinning switches.

As discussed above, while four current spinning phases are described in FIGS. 4-4C, it will become apparent from the discussions below in conjunction with FIGS. 6-8 that in accordance with the concepts, systems and techniques sought to be protected herein, only one phase, e.g., the coupling of FIG. 4, is used in the magnetic field sensor 300 of FIG. 3. Thus, in one aspect, current spinning is not used with the example embodiments disclosed herein.

Figure 5:
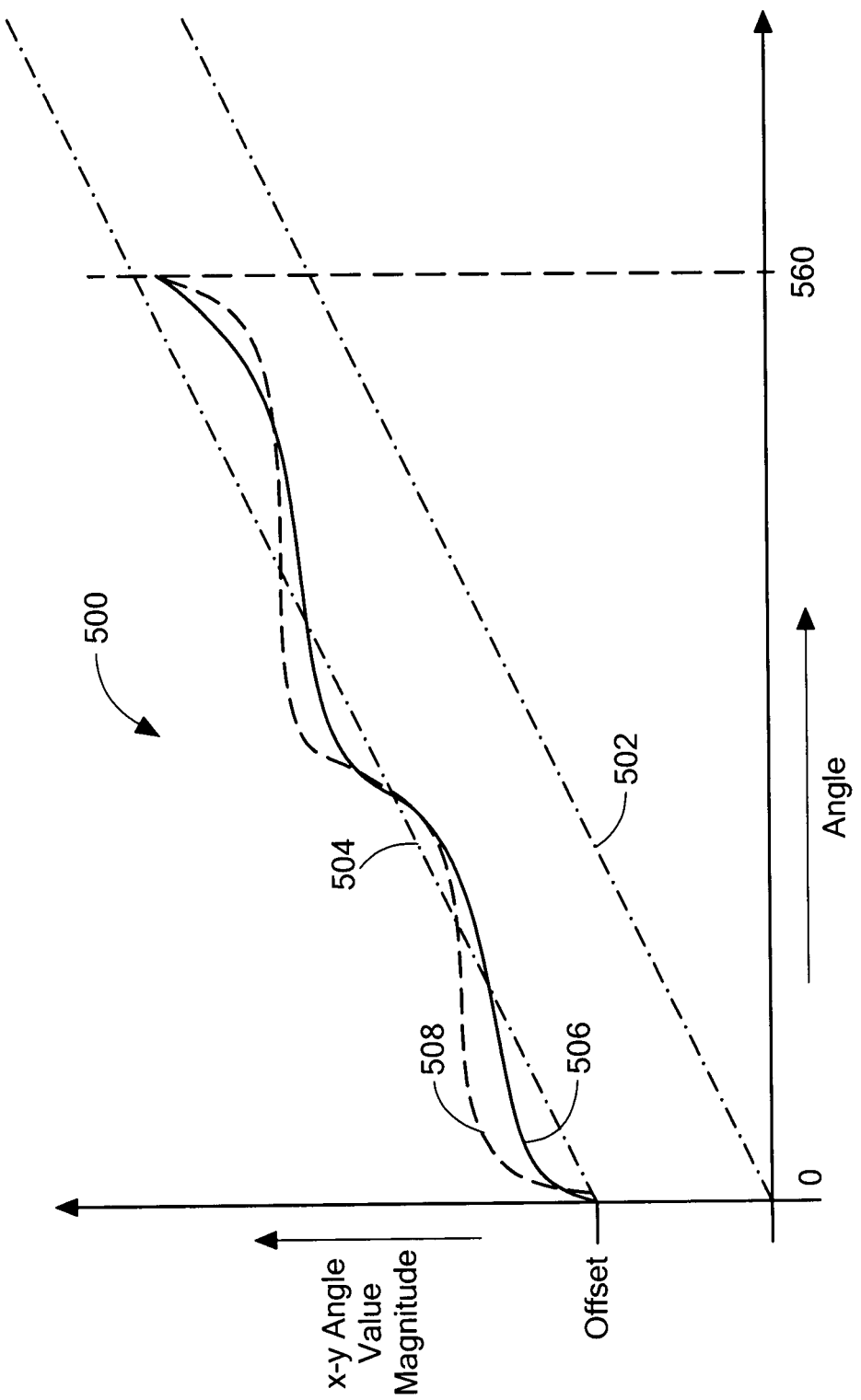
FIG. 5 is a graph showing ideal and non-ideal operation of the magnetic field sensor of FIG. 3.

Referring now to FIG. 5, a graph 500 has a horizontal axis with a scale in units of angular degrees and a vertical axis with a scale in units of value of an x-y angle value magnitude, for example, a magnitude of x-y angle values within the x-y angle signal 340*a* of FIG. 3.

A line 502 is representative of an x-y angle signal (i.e., a plurality of x-y angle values) that has no angle error. When the x-y angle signal has no angle error, the x-y angle signal is perfectly linear with respect to actual angle, i.e., the x-y angle signal is a perfect and true representation of the angle of the magnetic field generated by the magnet 314 of FIG. 3, and the line 502 passes through zero.

A line 504 is representative of an x-y angle signal that has only an average or DC angle error, such that all angles represented by the x-y angle signal are offset by a fixed number of degrees. The line 504 does not pass through zero.

A curve 506 is representative of an x-y angle signal that has errors in representation of the true angle of the magnetic field generated by the magnet 314, average or DC errors and also an error that has a sinusoidal appearance.

A curve 508 is representative of an x-y angle signal that has other errors in representation of the true angle of the magnetic field generated by the magnet 314.

A variety of circuit characteristics of the magnetic field sensor 300 contribute to the errors, i.e., to both the DC (or average) angle error represented by the curves 506, 508, and to the sinusoidal shapes of the curves 506, 508. One factor that contributes to the errors is switching noise generated by the sequence switches circuit 304 and/or by the current switches circuit 307 of FIG. 3. Another factor is different offset voltages among the vertical Hall elements within the CVH sensing element 302, for example, different offset voltages described above in conjunction with the signal 202 of FIG. 2. Another factor is different sensitivities of the various vertical Hall elements.

First, regarding the sequence switches circuit 304, it will be understood that charge injection or switching spikes (together referred to as noise) generated by the sequence switches 304 are not necessarily exactly the same as each sequential vertical Hall element is selected in the CVH sensing element 302. When the noise generated by the sequence switches 304 is not the same as each vertical Hall element is selected, a DC (or average) angle error is generated and also a sinusoidal type error such as that represented by the curves 506, 508. The sinusoidal error characteristic can be, in part, a result of the noise generated by the sequence switches being repetitive for each cycle around the CVH sensing element 302, and thus, the noise will have an angle error frequency component at a frequency of the signal 202 of FIG. 2, and will add to the signal 202 (304*a*, 304*b* of FIG. 3). The angle error frequency component is essentially fixed in phase relative the differential sequenced signal 304*a*, 304*b*, and therefore, the addition of the angle error causes different phase shift errors depending on the phase of the differential sequenced signal 304*a*, 304*b*. Higher harmonics can also result from the noise.

Next, regarding the current switches circuit 307, it will be understood that charge injection or switching spikes (together referred to as noise) generated by the current switches circuit 307 are not necessarily exactly the same as each sequential vertical Hall element is selected in the CVH sensing element 302. When the noise generated by the current switches circuit 307 is not the same as each vertical Hall element is selected, a DC (or average) angle error is generated and also a sinusoidal type error such as that represented by the curves 506, 508. The sinusoidal error characteristic can, in part, result from the noise generated by the current switches circuit 307 being repetitive for each cycle around the CVH sensing element 302.

Other circuit characteristics can also contribute to the angle errors, i.e., to both the DC (or average) angle error represented by the error curves 506, 508, and to the sinusoidal shapes of the error curves 506, 508. Namely, a speed with which the dual differential amplifier 322 of FIG. 3, and also other circuit elements of FIG. 3, are unable to settle to final values as the sequence switches circuit 304 switches among the vertical Hall elements of the CVH sensing element 302, and also as the current switches circuit 307 switch to each sequential vertical Hall element, contribute to the errors.

The above-described circuit characteristics, including, but not limited to, different offset voltages of the various vertical Hall elements within the CVH sensing element 302 of FIG. 3, differences of sensitivities of the various vertical Hall elements, and switching noise and lack of circuit elements settling to final values, tend to be influenced by (i.e., changed by) a variety factors including, but not limited to, temperature of the magnetic field sensor 300 of FIG. 3, a rate of sequencing around the CVH sensing element 302, peak magnitude of the magnetic field experience by the CVH sensing element 302 as the magnet 314 rotates, and selected current spinning sequence(s)(or lack thereof) among the various vertical Hall elements.

Differences between the curves 506, 508 can be attributed to changes in the same factors, namely, changes in the temperature, changes in or differences in peak amplitude of the magnetic field experience by the CVH sensing element 302 as the magnet 314 rotates, changes in offset voltages of the vertical Hall elements within the CVH sensing element 302, changes of sensitivities of the various vertical Hall elements, changes in or differences in rates of sequencing around the CVH sensing element 302, and changes in or differences in selected current spinning sequence(s) (or lack thereof) among the various vertical Hall elements within the CVH sensing element 302. Among these factors, it will be understood that the changes in the temperature can occur at any time. The changes in the peak amplitude of the magnetic field can be influenced by positional changes, i.e., air gap changes, between the magnet 314 and the CVH sensing element 302 of FIG. 3. The changes in the peak amplitude of the magnetic field can also be influenced by mechanical considerations, for example, wear of a bearing or the shaft 316 upon which the magnet 314 rotates. However, the changes in sequencing rates and the changes in current spinning sequences (or lack thereof) can be fixed, and changed only for different applications of the magnetic field sensor 300. The changes in offset voltages and changes in sensitivity of the vertical Hall elements tend to be influenced by changes in temperature.

In general, it has been determined that the dominant angle error frequency components occur at first and second harmonics of the frequency of the signal 202 (i.e., differential sequenced signal 304a, 304b). The curves 506, 508 are representative of angle error functions dominated by first and second harmonics of the frequency of the signal 202 (i.e., 304a, 304b).

As temperature varies, each harmonic component of the angle error represented by curves 506, 508 can change independently in amplitude and phase.

Figure 6:
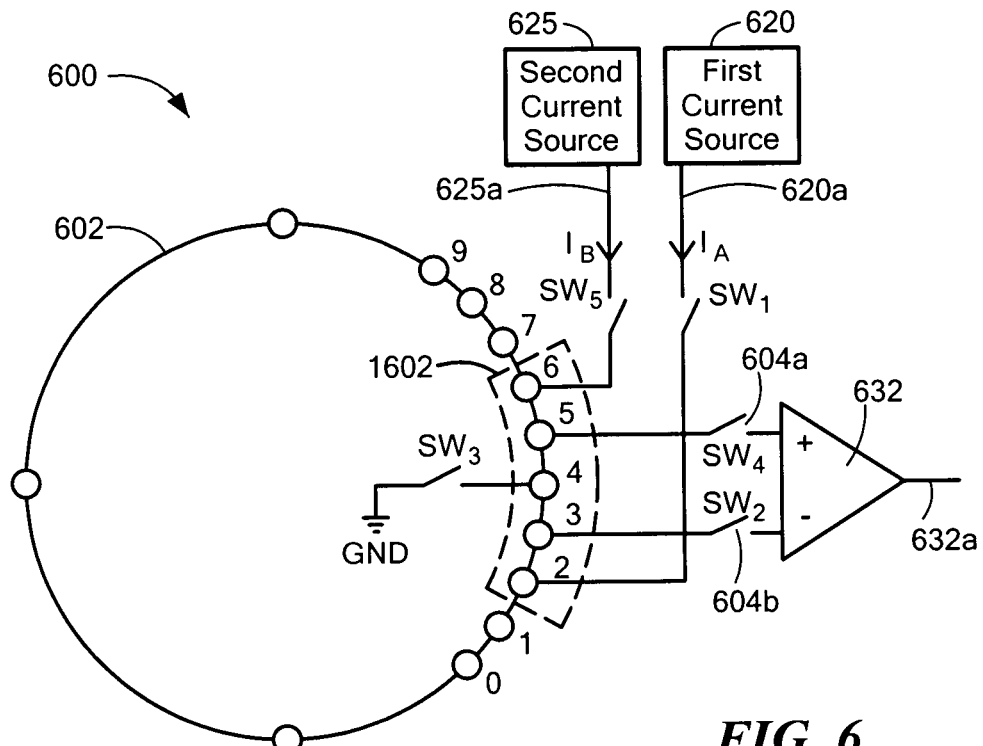
FIG. 6 is a block diagram of a portion of an example magnetic field sensor similar to the magnetic field sensor of FIG. 3 with first and second current sources coupled to a sequentially selected one of the vertical Hall elements of the CVH sensing element of the magnetic field sensor.

Referring now to FIG. 6, a portion of an example magnetic field sensor 600, which may be the same as or similar to the magnetic field sensor 300 of FIG. 3, includes a circular vertical Hall (CVH) sensing element 602, first and second current sources 620, 625, a respective plurality of switches ($SW_1$, $SW_2$, $SW_3$, $SW_4$, $SW_5$), and an amplifier circuit 632 coupled as shown. The respective plurality of switches is representative of switches in a sequence switches circuit, which can be the same as or similar to the sequence switches circuit 304 of FIG. 3. The magnetic field sensor 600 is shown configured in a first example coupling arrangement of a plurality of potential coupling arrangements. In a CVH sensing element comprising sixty-four vertical Hall elements, for example, there can be sixty-four potential coupling arrangements.

The CVH sensing element 602, similar to the CVH sensing element 302 of FIG. 3, comprises a plurality of vertical Hall elements (e.g., thirty-two or sixty-four vertical Hall elements), of which vertical Hall element 1602 is but one example. Vertical Hall element 1602 is representative of a sequentially selected one of the plurality of vertical Hall elements (e.g., a first selected one of the vertical Hall elements) that is selected and coupled to the first and second current sources 620, 625, first and second input terminals of the amplifier circuit 632, and a reference terminal (GND) by the respective plurality of switches ($SW_1$, $SW_2$, $SW_3$, $SW_4$, $SW_5$).

The vertical Hall element 1602, like other vertical Hall elements in the CVH sensing element 602, includes a plurality of vertical Hall element contacts, of which vertical Hall element contacts 2, 3, 4, 5, 6 are examples. While the vertical Hall element 1602 is shown having five vertical Hall element contacts 2, 3, 4, 5, 6, in other embodiments, a CVH sensing element can have vertical Hall elements with more than five or fewer than five vertical Hall element contacts, for example, four vertical Hall element contacts or six vertical Hall element contacts.

The vertical Hall element 1602, also like other vertical Hall elements in the CVH sensing element 602, includes respective first and second current receiving contacts 2, 6, respective first and second output signal generating contacts 3, 5, and a respective at least one reference contact 4. In the example embodiment shown, the at least one reference contact 4 is positioned between the first and second current receiving contacts 2, 6 and the first output signal generating contact 3 is positioned between the at least one reference contact 4 and the first current receiving contact 2. Additionally, in the example embodiment shown, the second output signal generating contact 5 is positioned between the at least one reference contact 4 and the second current receiving contact 6.

The coupling arrangement shown can be compared with the coupling arrangement of FIG. 4. Here, however, the one current source 408 shown in FIG. 4, which generates a split current to two different vertical Hall element contacts 402a, 402e, is replaced by the first and second current sources 620, 625, respectively, with no current splitting.

The reference potential (here, labeled GND) is sequentially coupled to the at least one reference contact 4 by a third switch $SW_3$ of the respective plurality of switches. In one embodiment, the reference potential can be provided as a system ground. In another embodiment, the reference potential can be provided as an earth ground. However, other reference potentials can also be used.

Additionally, the first current source 620, which can be the same as or similar to the first current source 320 of FIG. 3, is sequentially coupled to the first current receiving contact 2 by a first switch $SW_1$ of the respective plurality of switches. The first current source 620 is operable to provide, at a first sequential time, a first current signal 620a to the first current receiving contact 2.

Moreover, the second current source 625, which can be the same as or similar to the second current source 325 of FIG. 3, is sequentially coupled to the second current receiving contact 6 by a fifth switch $SW_5$ of the respective plurality of switches. The second current source 625 is operable to provide, at substantially the same first sequential time, a second current signal 625a to the second current receiving contact 6. In one embodiment, the first current signal 620a and the 15 second current signal 625a are substantially equal in magnitude. In another embodiment, the first current signal 620a and the second current signal 625a are unequal in magnitude. In some embodiments, particularly where the first current signal 620a and the second current signal 625a are unequal in magnitude, a current swapping operation described more fully below can be performed.

The vertical Hall element 1602, in response to receiving first and second current signals 620a, 625a at the first and second current receiving contacts 2, 6, is configured to generate a first step of a first sequenced signal (or, more simply, a first sequenced signal step), responsive to an external magnetic field, at the first and second output signal generating contacts 3, 5. As discussed above, sequenced signals are comprised of sequential ones of a plurality of magnetic field signals or "steps."

The amplifier circuit 632, which can be the same as or similar to the DA 332 of FIG. 3, is coupled to receive the first sequenced signal step, which can be the same as or similar to a first portion in time of the differential sequenced signal 304a, 304b of FIG. 3, from the first and second output signal generating contacts 3, 5 at the first and second input terminals of the amplifier circuit 632. In one embodiment, similar to DA 332, the amplifier circuit 632 can be coupled to receive the first sequenced signal step from the first and second output signal generating contacts 3, 5 in a Kelvin connection arrangement.

A Kelvin connection will be understood to be a four-wire sensing arrangement that uses two current-carrying and two voltage-sensing connections. Here, the Kelvin connection can, for example, substantially reduce or eliminate parasitic resistance contributions of switches $SW_2$ and $SW_4$ when coupling the first and second output signal generating contacts 3, 5 to the amplifier circuit 632.

The amplifier circuit 632, in response to receiving the first sequenced signal step, is configured to generate a first amplified signal 632a representative of a sequentially selected one of a plurality of magnetic field signals at an output thereof. The first amplified signal 632a can, for example, be received by a bandpass filter and an ADC, the same as or similar to bandpass filter 324 and ADC 326 of FIG. 3. A signal representative of the first amplified signal 632a can also be received by a data processing circuit, the same as or similar to data processing circuit 340, for generating an x-y angle signal indicative of the angle of the magnetic field generated by a magnet.

Figure 6A:
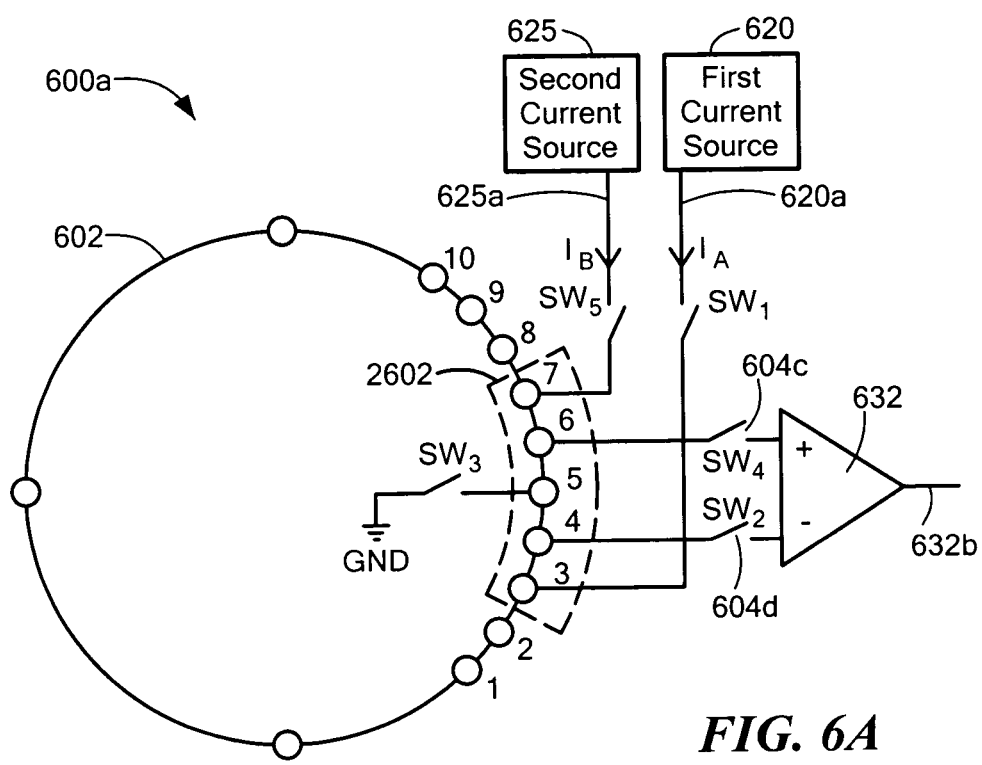
FIG. 6A is a block diagram of the portion of the example magnetic field sensor of FIG. 6 with the first and second current sources coupled to another sequentially selected one of the vertical Hall elements.

Referring now to FIG. 6A, in which like elements of FIG. 6 are shown having like reference designations, a magnetic field sensor 600a is the same as or similar to the magnetic field sensor 600 of FIG. 6. Here, however, the magnetic field sensor 600a is shown with couplings to another vertical Hall element 2602, which is representative of another sequentially selected one of the plurality of vertical Hall elements (e.g., a second sequentially selected one of the plurality of vertical Hall elements) of the CVH sensing element 602. Additionally, here the contacts of the vertical Hall element 2602 are coupled (e.g., to first and second current sources 620, 625) via a set of switches ($SW_1$-$SW_5$), which are labeled the same ($SW_1$-$SW_5$) as the switches of vertical Hall element 1602 of FIG. 6 for convenience but are not actually the same. In particular, each contact comprises about five switches for switching between different positions (e.g., a switch for coupling to ground, a switch for coupling to the first current source 620, a switch for coupling to the second current source 625, and a plurality of switches for coupling to the amplifier circuit amplifier circuit 632) and, thus, the switches for each sequentially selected one of the plurality of vertical Hall elements are not the same.

Returning now to FIG. 6A, the vertical Hall element 2602, like vertical Hall element 1602, includes a plurality of vertical Hall element contacts, of which vertical Hall element contacts 3, 4, 5, 6, 7 are examples. The vertical Hall element 2602, also like the vertical Hall element vertical Hall element 1602, includes respective first and second current receiving contacts 3, 7, respective first and second output signal generating contacts 4, 6, and a respective at least one reference contact 5 in accordance with the concepts, systems, circuits and techniques sought to be protected herein. The magnetic field sensor 600a is shown configured in a second example coupling arrangement of the plurality of potential coupling arrangements described above. As apparent, the vertical Hall element 2602 is shifted by one vertical Hall element contact with respect to the vertical Hall element 1602 in the CVH sensing element 602. While the vertical Hall element 2602 is shown being shifted by one vertical Hall element contact with respect to the vertical Hall element 1602 in the CVH sensing element 602, in other embodiments, sequential vertical Hall elements may be shifted by more than one contact, for example, two or three contacts.

As illustrated, the reference potential (GND) is sequentially coupled to the at least one reference contact 5 by the respective third switch $SW_3$, the first current source 620 is sequentially coupled to the first current receiving contact 3 by the respective first switch $SW_1$, and the second current source 625 is sequentially coupled to the second current receiving contact 6 by the respective fifth switch $SW_5$.

The vertical Hall element 2602, in response to receiving first and second current signals 620a, 625a at the first and second current receiving contacts 3, 7, is configured to generate a second step of the first sequenced signal (or, more simply, a second sequenced signal step or a first sequenced signal step of the second example coupling arrangement), responsive to an external magnetic field, at the first and second output signal generating contacts 4, 6.

The amplifier circuit 632 is coupled to receive the second sequenced signal step which can be the same as or similar to a second portion in time of the differential sequenced signal 304a, 304b of FIG. 3, from the first and second output signal generating contacts 4, 6 at the first and 35 second amplifier circuit inputs and is configured to generate a second amplified signal 632b (or, more simply, a first amplified signal of the second example coupling arrangement) representative of a second sequentially selected one of the above-mentioned plurality of magnetic field signals.

In embodiments where it is difficult, yet desirable to provide first and second current signals 620a, 625a of substantially equal magnitude, for example, a current swapping operation can be used. In particular, the first and second current sources 620, 625 can swap couplings in half-period intervals (e.g., first and second half-period intervals, e.g., half sub-steps of the steps of FIG. 2) for each of the plurality of coupling arrangements, e.g., the first example coupling arrangement of FIG. 6 and the second example coupling arrangement of FIG. 6A, and for all of the plurality of coupling arrangements as samples are taken around the CVH sensing element 602.

For example, in a first half-period interval of the second example coupling arrangement of FIG. 6A, the first current source 620 can be coupled to the first current receiving contact 3 of the vertical Hall element 2602 by switch $SW_1$ and the second current source 625 can be coupled to the second current receiving contact 7 by switch $SW_5$ as shown. Additionally, in a second half-period interval of the second example coupling arrangement of FIG. 6A, the second current source 625 can be sequentially coupled to the first current receiving contact 3 of the vertical Hall element 2602 by another switch (not shown) and the first current source 620 can be coupled to the second current receiving contact 7 of the vertical Hall element 2602 by another switch (not shown). During the first half-period interval, the vertical Hall element 2602, in response to receiving first and second current signals 620a, 620b at the first and second current receiving contacts 3, 7, is configured to generate a first sub-step of a second sequenced signal step at the first and second output signal generating contacts 3, 7. Similarly, during the second half-period interval, the vertical Hall element 2602 is configured to generate a second sub-step of the second sequenced signal step at the first and second output signal generating contacts 3, 7.

Continuing with the example of the second coupling arrangement of FIG. 6A, during both the first half-period interval and during the second half-period interval, the amplifier 632 remains coupled to the first and second output signal generating contacts 4, 6. Thus, both the first sub-step of the second sequenced signal step generated during the first half-period interval and the second sub-step of the second sequenced signal step generated during the second half-period interval are received by the amplifier 632. With this current swapping technique, the resulting amplified signal 632 (e.g., 632a, 632b) has twice the number of samples (i.e., steps) as the number of sampled vertical Hall elements in the CVH sensing element 602.

It should be understood that the above-described current swapping technique can result in a lower offset voltage in the amplified signal 632, particularly when the first and second current sources 620, 625 are not equal. The coupling and process illustrated above in conjunction with FIGS. 6 and 6A can be completed for each sequentially selected one of the plurality of vertical Hall elements of the CVH sensing element 602. In the case of the CVH sensing element 602 comprising sixty-four vertical Hall elements, the coupling and process can, for example, be completed for each of the sixty-four vertical Hall elements.

It can be shown that by cycling through each of the vertical Hall element contacts of a CVH sensing element (e.g., CVH sensing element 602) and performing the above-mentioned coupling and process, the offset error associated with the CVH sensing element can be reduced or even eliminated, as will become apparent from the discussion below.

Figure 7:
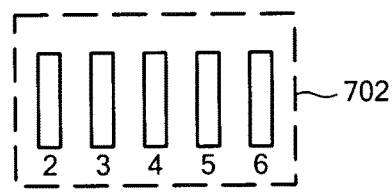
FIG. 7 is a block diagram showing vertical Hall element contacts of an example sequentially selected vertical Hall element.

Referring now to FIG. 7, a vertical Hall element 702 can be representative of the sequentially selected vertical Hall element 1602 of FIG. 6. As described above, each sequentially selected one of the vertical Hall elements of the CVH sensing element 602 of FIGS. 6 and 6A comprises a plurality of vertical Hall element contacts (e.g., five vertical Hall element contacts), here labeled 2-6 with the labels comparable in other figures above and below.

Figure 7A:
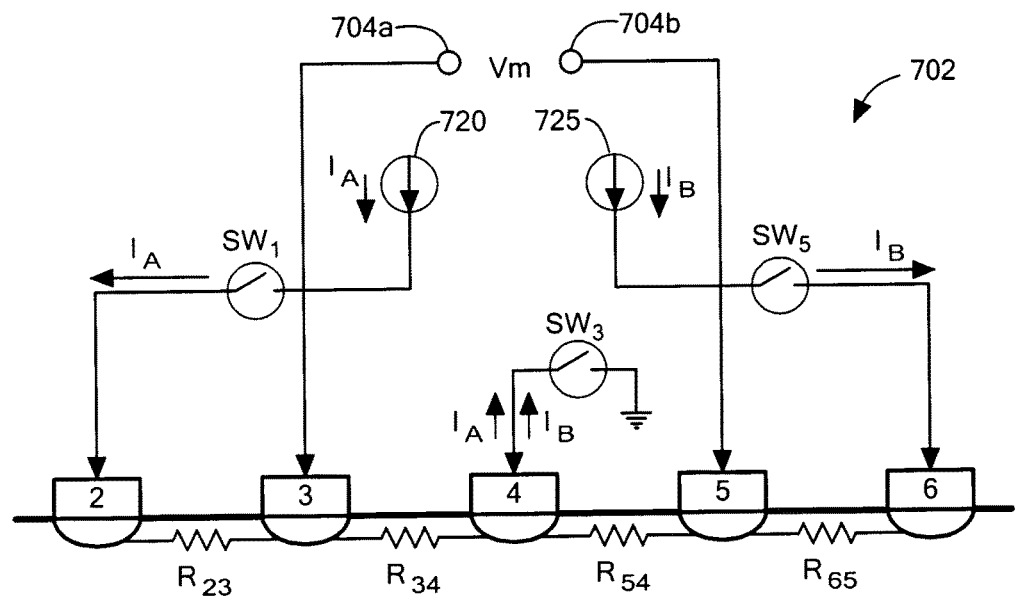
FIG. 7A is a side view of the sequentially selected vertical Hall element of FIG. 7 showing bulk resistance that exists between the respective first and second current receiving contacts, the respective reference contact, and the respective first and second output signal generating contacts.

Referring now to FIG. 7A, in which like elements of FIG. 7 are shown having like reference designations, the vertical Hall element 702 is shown to be fixed in a phase similar to that of FIG. 4. Here, however, current receiving contacts 2, 6 are shown coupled to first and second current sources 720, 725 rather than the single current source 408 of FIG. 4. In one embodiment, use of the first and second current sources 720, 725 in contrast with the single current source 408 ensures that the current signals 720a, 725a received by the first and second current receiving contacts 2, 6 are substantially the same. In another embodiment, the use of the first and second current sources 720, 725 provides the capability of generating first and second current signals 720a, 725a of unequal magnitude.

As illustrated, resistors $R_{23}$, $R_{34}$, $R_{54}$, and $R_{65}$ are shown between each adjacent pair of vertical Hall element contacts 2-3, 3-4, 4-5, 5-6, respectively. The resistors $R_{23}$, $R_{34}$, $R_{54}$, and $R_{65}$ are representative of bulk resistance in a substrate upon which the vertical Hall element 702 is formed. The bulk resistance may, for example, arise due to properties of the substrate over which the vertical Hall element contacts 2, 3, 4, 5, and 6 are formed and can vary based upon a wide variety of factors including the composition of the substrate material and the temperature thereof.

In cycling through each of the vertical Hall element contacts of a CVH sensing element (e.g., CVH sensing element 602 of FIG. 6) and performing the coupling and process described in conjunction with the above figures, the offset errors associated with each of the vertical Hall elements of the CVH sensing element can be significantly reduced, as illustrated in Table 1700 shown in FIG. 7B. Referring now to FIG. 7B, Table 1700 illustrates offset voltage cancellations of the first ten vertical Hall elements of an example CVH sensing element comprising sixty-four vertical Hall elements, with each vertical Hall element comprising five vertical Hall element contacts. A high frequency offset, rather than a first or subsequent harmonic, is added to an output signal as may be generated by a CVH sensing element (e.g., CVH sensing element 602 of FIG. 6). As illustrated in Table 1700, when current signals IA and IB are substantially the same as a result of first and second current sources (e.g., first and second current sources 620, 625 of FIG. 6) being capable of producing first and second current signals (e.g., first and second current signals 620a, 625a of FIG. 6) of a substantially equal magnitude or as a result of the current swapping operation discussed above in conjunction with FIG. 6A, for example, corresponding current terms substantially cancel in each sequential coupling arrangement. In particular, an average current of (IA+IB)/2 is produced at each half-period of each sequential coupling arrangement, which results in one or more offset cancellations upon completion of each full-period of the sequential coupling arrangements.

In Table 1700, it should be recognized that resistance from vertical Hall element contact x to vertical Hall element contact y ($R_{x,y}$) is the same as resistance from vertical Hall element contact y to vertical Hall element contact x ($R_{y,x}$). In particular, at least a portion of the offset errors associated with the sequenced signals (or steps of the sequenced signals) produced at corresponding output signal generating contacts of each vertical Hall element are canceled upon cycling through each of the vertical Hall elements of the CVH sensing element. Remaining offset errors (if any) can, for example, be corrected in signal processing circuitry and data processing circuitry coupled to receive the sequenced signal (or steps of the sequenced signals), similar to signal processing circuitry 330 and data processing circuit 340 of FIG. 3.

Figure 8:
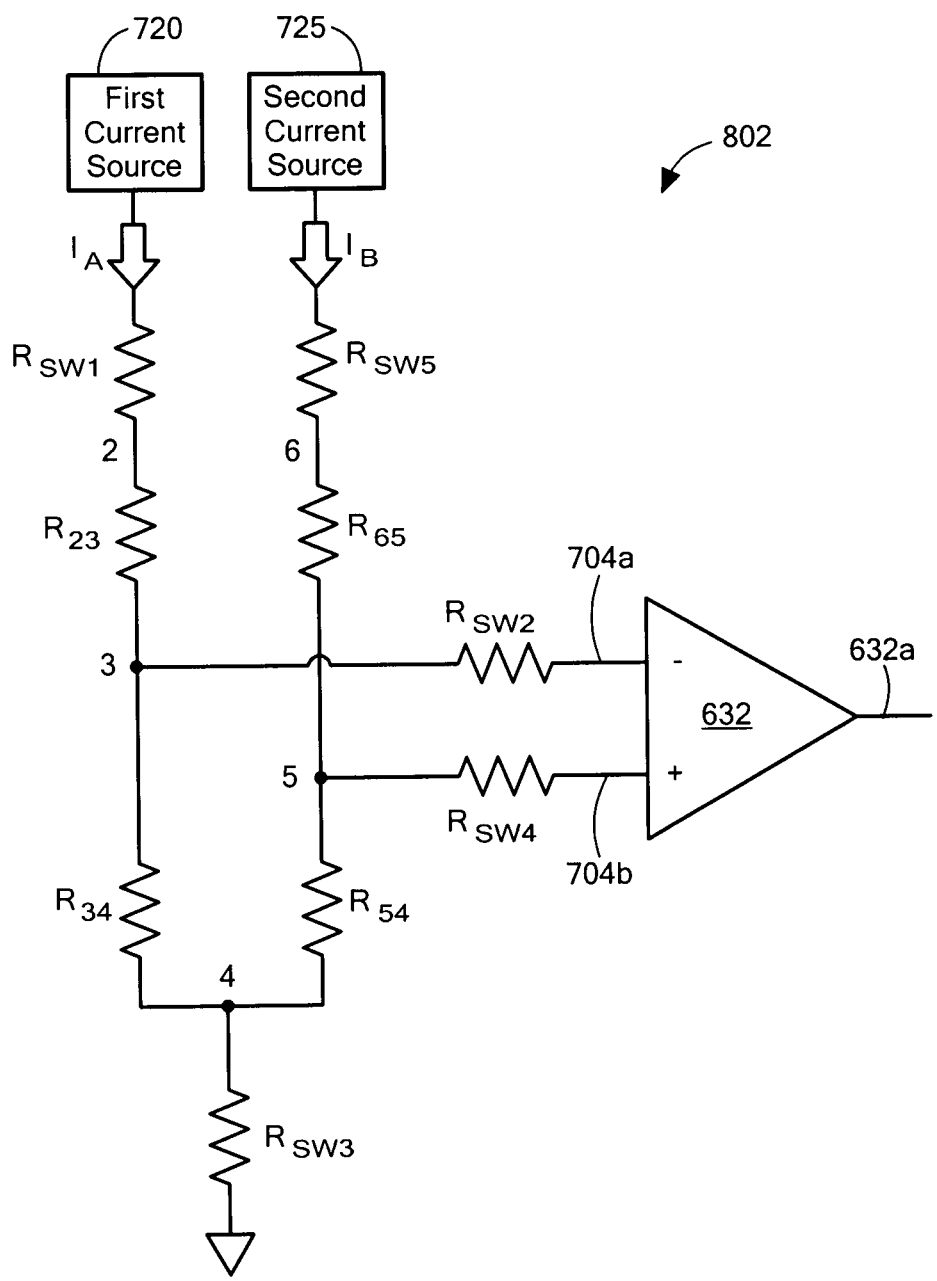
FIG. 8 is a schematic showing an equivalent circuit of the vertical Hall element of FIG. 7A coupled to an amplifier circuit.

Referring now to FIG. 8, in which like elements of FIG. 7A are shown having like reference designations, an equivalent circuit 802 is shown which is representative of the vertical Hall element 702 of FIG. 7. As illustrated in FIG. 8 and as described above with respect to FIG. 7, a bulk resistance, as represented by resistors $R_{23}$, $R_{34}$, $R_{54}$, and $R_{65}$, exists between each adjacent pair of vertical Hall element contacts 2-3, 3-4, 4-5, 5-6, respectively. In addition to the aforesaid, a contact resistance $R_{sw1}$ (i.e., a switch resistance) exists between the first current source 720 and the first current receiving contact 2, a contact resistance $R_{sw2}$ exists between the first input terminal of the amplifier circuit 632 and the first output signal generating contact 3, a contact resistance $R_{sw3}$ exists between the at least one reference contact 4 and the reference potential (GND), a contact resistance $R_{sw4}$ exists between the second input terminal of the amplifier circuit 632 and the second output signal generating contact 5, and a contact resistance $R_{sw5}$ exists between the second current source 725 and the second current receiving contact 6. The contact resistances are a result of the resistance associated with the first, second, third, fourth, and fifth switches, as denoted by $R_{SW1}$, $R_{SW2}$, $R_{SW3}$, $R_{SW4}$, and $R_{SW5}$, respectively.

In operation, the vertical Hall element represented by the equivalent circuit 802 generates a differential voltage between vertical Hall element contacts 3 and 5 in response to a magnetic field. The differential voltage is related to resistance changes of the bulk resistances, in particular $R_{34}$, $R_{54}$, that change with the magnetic field. Is should be understood that the bulk resistances $R_{23}$, $R_{65}$ or changes thereof have little effect upon the differential voltage. The resistances $R_{23}$, $R_{65}$ merely add in series to the high output impedances of the first and second current sources 720, 725, respectively, and thus, do not affect currents $I_A$ and $I_B$.

With regard to the contact resistances, it will be understood that, if an input impedance of the amplifier 632 is high, then the contact resistances $R_{sw2}$, $R_{sw4}$ do not affect the differential voltage. The contact resistance $R_{sw3}$ also has little effect upon the differential voltage. Still further, the contact resistances $R_{SW1}$ and $R_{SW5}$ also merely add in series to the high output impedances of the first and second current sources 720, 725, respectively, and thus, do not affect currents $I_A$ and $I_B$, and therefore, also have little or no impact upon the differential voltage. Thus by use of a Kelvin connection, influence of various contact resistances upon the differential voltage between the vertical Hall element contacts 3 and 5 can be reduced or eliminated.

The concepts discussed above in conjunction with FIGS. 6-7A can also similarly be applied to equivalent circuit 802 for reducing the offset error associated with the vertical Hall element 702. In particular, a magnetic field sensor with reduced offset error is achieved through cancellation of the offset errors associated with each of the vertical Hall elements.

A particular coupling according to FIG. 4 has been described above in FIGS. 6-8. It will be apparent, however, that couplings according to FIGS. 4A-4C can also be used, but with an undesirable increase in the influence of contact resistances upon the detected differential voltage.

Additionally, it will be apparent that the concepts discussed above provide several advantages over conventional magnetic field sensing elements and associated methods, including the substantial reduction or elimination of chopping at each CVH index, parasitic resistance contributions of switches for coupling output signal generating contacts (e.g., output signal generating contacts 3, 5 of FIG. 6) to amplifier circuits (e.g., amplifier circuit 632 of FIG. 6), for example, and thus can eliminate the need for larger switches to reduce or eliminate unbalanced currents resulting from the parasitic resistance contributions of the switches. Further, the concepts discussed above provide methods for providing first and second current signals of substantially equal magnitude to first and second current receiving contacts (e.g., first and second current receiving contacts 2, 6 of FIG. 6) of sequentially selected ones of the plurality of vertical Hall elements.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above. Accordingly, it is submitted that that scope of the patent should not be limited to the described embodiments but rather should be limited only by the spirit and scope of the following claims.

What is claimed is:

1. A magnetic field sensor, comprising:
   a circular vertical Hall (CVH) sensing element comprising:
   a plurality of vertical Hall elements, each one of the plurality of vertical hall elements comprising respective first and second current receiving contacts, respective first and second output signal generating contacts, and a respective at least one reference contact, wherein the at least one reference contact is positioned between the first and second current receiving contacts, the first output signal generating contact is positioned between the at least one reference contact and the first current receiving contact, and the second output signal generating contact is positioned between the at least one reference contact and the second current receiving contact; wherein the plurality of vertical Hall elements is configured to generate a plurality of magnetic field signals, each magnetic field signal responsive to a magnetic field;
   the magnetic field sensor further comprising:
   a sequence switches circuit coupled to the plurality of vertical Hall elements, wherein the sequences switches circuit is operable to sequentially select from among the plurality of vertical Hall elements to generate sequenced signal steps;
   a first current source sequentially coupled by the sequence switches circuit to the first current receiving contact of sequentially selected ones of the plurality of vertical Hall elements, and operable to provide, at first sequential times, a first current signal to the first current receiving contact of the sequentially selected ones of the plurality of vertical Hall elements;
   a second current source sequentially coupled by the sequence switches circuit to the second current receiving contact of the sequentially selected ones of the plurality of vertical Hall elements and operable to provide, at the same first sequential times, a second current signal to the second current receiving contact of the sequentially selected ones of the plurality of vertical Hall elements; and
   an amplifier circuit coupled to receive the sequenced signal steps produced at the first and second output signal generating contacts of the sequentially selected ones of the plurality of vertical Hall elements, and, in response to the sequenced signal steps, the amplifier circuit is configured to generate an amplified signal representative of sequentially selected ones of the plurality of magnetic field signals,
   wherein the first current source is sequentially coupled by the sequence switches circuit to the second current receiving contact of the sequentially selected ones of the plurality of vertical Hall elements, and operable to provide, at second sequential times, the first current signal to the second current receiving contact of the sequentially selected ones of the plurality of vertical Hall elements; and
   wherein the second current source is sequentially coupled by the sequence switches circuit to the first current receiving contact of the sequentially selected ones of the plurality of vertical Hall elements, and operable to provide, at the same second sequential times, the second current signal to the first current receiving contact of the sequentially selected ones of the plurality of vertical Hall elements.

2. The magnetic field sensor of claim 1, wherein the vertical Hall elements are not configured in a current spinning arrangement.

3. The magnetic field sensor of claim 1, wherein the first current signal and the second current signal are substantially equal in magnitude.

4. The magnetic field sensor of claim 1, wherein the amplifier circuit is coupled to the select first and second output generating contacts in a Kelvin connection arrangement.

5. The magnetic field sensor of claim 1, wherein an input impedance of the amplifier circuit is substantially more than an output impedance of the first and second output generating contacts of the sequentially selected ones of the plurality of vertical Hall elements.

6. The magnetic field sensor of claim 1, wherein each selected one of the plurality of vertical Hall elements comprises five vertical Hall element contacts.

7. The magnetic field sensor of claim 1, wherein the at least one reference contact is coupled to a reference potential.

8. The magnetic field sensor of claim 7, wherein the reference potential is ground.

9. The magnetic field sensor of claim 1, wherein the first current signal and the second current signal are substantially unequal in magnitude.

10. A method, comprising:
generating a plurality of magnetic field signals with a circular vertical Hall (CVH) sensing element, the CVH sensing element comprising a plurality of vertical Hall elements, each one of the plurality of vertical hall elements comprising respective first and second current receiving contacts, respective first and second output signal generating contacts, and a respective at least one reference contact, wherein the at least one reference contact is positioned between the first and second current receiving contacts, the first output signal generating contact is positioned between the at least one reference contact and the first current receiving contact, and the second output signal generating contact is positioned between the at least one reference contact and the second current receiving contact, each magnetic field signal being responsive to a magnetic field;
sequentially selecting from among the plurality of vertical Hall elements;
generating a first current signal and providing, at first sequential times, the first current signal to the first current receiving contact of sequentially selected ones of the plurality of vertical Hall elements;
generating a second current signal and providing, at the same first sequential times, the second current signal to the second current receiving contact of the sequentially selected ones of the plurality of vertical Hall elements;
generating a first sequenced signal step, responsive to an external magnetic field, at the first and second output generating contacts of the sequentially selected ones of the plurality of vertical Hall elements;
generating the first current signal and providing, at second sequential times, the first current signal to the second current receiving contact of sequentially selected ones of the plurality of vertical Hall elements;
generating the second current signal and providing, at the same second sequential times, the second current signal to the first current receiving contact of the sequentially selected ones of the plurality of vertical Hall elements;
generating a second sequenced signal step, responsive to the external magnetic field, at the first and second output generating contacts of the sequentially selected ones of the plurality of vertical Hall elements; and
generating an amplified signal representative of sequentially selected ones of the plurality of magnetic field signals in response to at least the first and second sequenced signal steps.

11. The method of claim 10, wherein the first current signal and the second current signal are substantially equal in magnitude.

12. The method of claim 10, wherein each selected one of the plurality of vertical Hall elements comprises five vertical Hall element contacts.

13. The method of claim 10, wherein the at least one reference contact is coupled to a reference potential.

14. The method of claim 13, wherein the reference potential is ground.

15. The method of claim 10, wherein the first current signal and the second current signal are substantially unequal in magnitude.

16. A magnetic field sensor, comprising:
a circular vertical Hall (CVH) sensing element comprising:
a plurality of vertical Hall elements, each one of the plurality of vertical hall elements comprising respective first and second current receiving contacts, respective first and second output signal generating contacts, and a respective at least one reference contact, wherein the at least one reference contact is positioned between the first and second current receiving contacts, the first output signal generating contact is positioned between the at least one reference contact and the first current receiving contact, and the second output signal generating contact is positioned between the at least one reference contact and the second current receiving contact; wherein the plurality of vertical Hall elements is configured to generate a plurality of magnetic field signals, each magnetic field signal responsive to a magnetic field;
the magnetic field sensor further comprising:
means for sequentially selecting from among the plurality of vertical Hall elements to generate sequenced signal steps;
means for providing, at first sequential times, a first current signal to the first current receiving contact of the sequentially selected ones of the plurality of vertical Hall elements;
means for providing, at the same first sequential times, a second current signal to the second current receiving contact of the sequentially selected ones of the plurality of vertical Hall elements;
means for providing, at second sequential times, the first current signal to the second current receiving contact of sequentially selected ones of the plurality of vertical Hall elements;
means for providing, at the same second sequential times, the second current signal to the first current receiving contact of the sequentially selected ones of the plurality of vertical Hall elements; and
means for generating an amplified signal representative of sequentially selected ones of the plurality of magnetic field signals in response to receiving the sequenced signal steps produced at the first and second output signal generating contacts of the sequentially selected ones of the plurality of vertical Hall elements.

17. The magnetic field sensor of claim 16, wherein the first current signal and the second current signal are substantially equal in magnitude.

18. The magnetic field sensor of claim 16, wherein the means for generating an amplified signal is coupled to the select first and second output generating contacts in a Kelvin connection arrangement.

19. The magnetic field sensor of claim 16, wherein the first current signal and the second current signal are substantially unequal in magnitude.

20. The magnetic field sensor of claim 16, wherein each selected one of the plurality of vertical Hall elements comprises five vertical Hall element contacts.

* * * * *

UNITED STATES PATENT AND TRADEMARK OFFICE
CERTIFICATE OF CORRECTION

PATENT NO. : 9,684,042 B2
APPLICATION NO. : 14/633190
DATED : June 20, 2017
INVENTOR(S) : Aurelian Diaconu Page 1 of 2

It is certified that error appears in the above-identified patent and that said Letters Patent is hereby corrected as shown below:

On the Title Page

(73) delete "Allegro Microsystems, LLC," and replace with --Allegro MicroSystems, LLC,--.

In the Specification

Column 2, Line 35 delete "vertical hall" and replace with --vertical Hall--.

Column 3, Line 36 delete "hall" and replace with --Hall--.

Column 4, Line 16 delete "hall" and replace with --Hall--.

Column 9, Line 11 delete "field 16." and replace with --field 116.--.

Column 10, Line 13 delete "hall" and replace with --Hall--.

Column 10, Line 18 delete "hall" and replace with --Hall--.

Column 10, Line 42 delete "(DA) 332," and replace with --(DDA) 332,--.

Column 10, Line 43 delete "The DA 332," and replace with --The DDA 332,--.

Column 10, Line 47 delete "The DA 332 can" and replace with --The DDA 332 can--.

Column 10, Line 49 delete "the DA 332" and replace with --the DDA 332--.

Column 11, Line 65 delete "vertical a Hall" and replace with --vertical Hall--.

Column 12, Line 24 delete "vertical Hal" and replace with --vertical Hall--.

Signed and Sealed this
Eighth Day of January, 2019

Andrei Iancu
*Director of the United States Patent and Trademark Office*

Column 14, Line 64 delete "sequence(s)(or lack thereof)" and replace with --sequence(s) (or lack thereof)--.

Column 16, Line 64 delete "the DA 332 of FIG. 3" and replace with --the DDA 332 of FIG. 3,--.

Column 17, Line 3 delete "to DA 332," and replace with --to DDA 332,--.

Column 18, Line 23 delete "and 35 second" and replace with --and second--.

Column 20, Line 65 delete "Is should be" and replace with --It should be--.

In the Claims

Column 22, Line 8 delete "hall" and replace with --Hall--.

Column 23, Line 31 delete "hall" and replace with --Hall--.

Column 24, Line 24 delete "hall" and replace with --Hall--.